US011506346B2

(12) United States Patent
Kozuru et al.

(10) Patent No.: US 11,506,346 B2
(45) Date of Patent: Nov. 22, 2022

(54) LIGHT EMITTING DEVICE

(71) Applicant: NICHIA CORPORATION, Anan (JP)

(72) Inventors: Kazuma Kozuru, Anan (JP); Shinichi Nagahama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/393,711

(22) Filed: Aug. 4, 2021

(65) Prior Publication Data
US 2021/0364134 A1 Nov. 25, 2021

Related U.S. Application Data

(63) Continuation of application No. 16/775,432, filed on Jan. 29, 2020, now Pat. No. 11,112,069, which is a
(Continued)

(30) Foreign Application Priority Data

Apr. 18, 2014 (JP) ................. 2014-086931

(51) Int. Cl.
F21K 9/64 (2016.01)
F21V 13/08 (2006.01)
(Continued)

(52) U.S. Cl.
CPC ............ F21K 9/64 (2016.08); F21V 13/08 (2013.01); F21V 29/74 (2015.01); H01S 5/0087 (2021.01);
(Continued)

(58) Field of Classification Search
CPC . F21K 9/64; F21V 13/08; F21V 29/74; H01S 5/0087; H01S 5/02325;
(Continued)

(56) References Cited

U.S. PATENT DOCUMENTS 5,001,719 A 3/1991 Trussell
6,327,285 B1 12/2001 Wang
(Continued)

FOREIGN PATENT DOCUMENTS

DE 112014002330 A5 1/2016
JP 61168247 A 7/1986
(Continued)

OTHER PUBLICATIONS

Machine English Translation of Japanese Application 2014-080595 Apr. 9, 2014. Provided for US 2015/0292687.
(Continued)

Primary Examiner — Rajarshi Chakraborty
Assistant Examiner — Glenn D Zimmerman
(74) Attorney, Agent, or Firm — Mori & Ward, LLP

(57) ABSTRACT

A light emitting device includes a base; a plurality of semiconductor laser elements disposed on the base and configured to emit light laterally from the plurality of semiconductor laser elements; a reflecting member disposed on the base and configured to reflect light from the semiconductor laser elements; a surrounding part disposed on the base and surrounding the semiconductor laser elements and the reflecting member; a wiring part disposed on the base so as to extend to a location outside of the surrounding part; a radiating body disposed on the surrounding part and having an opening; and a wavelength converting member that is located in the opening of the radiating body, the wavelength converting member being configured to convert a wavelength of light that is emitted from the plurality of semiconductor laser elements and reflected upward by the reflecting member.

17 Claims, 3 Drawing Sheets

Related U.S. Application Data continuation of application No. 16/103,879, filed on Aug. 14, 2018, now Pat. No. 10,587,091, which is a continuation of application No. 14/689,984, filed on Apr. 17, 2015, now Pat. No. 10,079,470.

(51) Int. Cl.

| | | |
|---|---|---|
| *F21V 29/74* | (2015.01) | |
| *H01S 5/02325* | (2021.01) | |
| *H01S 5/00* | (2006.01) | |
| *H01S 5/024* | (2006.01) | |
| *F21Y 101/00* | (2016.01) | |
| *F21Y 115/30* | (2016.01) | |
| *H01S 5/02208* | (2021.01) | |
| *H01S 5/40* | (2006.01) | |

(52) U.S. Cl.
CPC ....... *H01S 5/02325* (2021.01); *F21Y 2101/00* (2013.01); *F21Y 2115/30* (2016.08); *H01L 2224/48091* (2013.01); *H01S 5/0071* (2013.01); *H01S 5/02208* (2013.01); *H01S 5/02469* (2013.01); *H01S 5/4056* (2013.01)

(58) Field of Classification Search
CPC ............... H01S 5/0071; H01S 5/02208; H01S 5/02469; H01S 5/4056; F21Y 2101/00; F21Y 2115/30; H01L 2224/48091
See application file for complete search history.

(56) References Cited

U.S. PATENT DOCUMENTS

| | | | |
|---|---|---|---|
| 6,816,528 | B1 | 11/2004 | Kneissl et al. |
| 9,689,537 | B2 * | 6/2017 | Ueno ......................... F21V 5/04 |
| 2003/0076862 | A1 | 4/2003 | Itoh |
| 2004/0101006 | A1 | 5/2004 | Iwafuji |
| 2005/0237739 | A1 | 10/2005 | Lee et al. |
| 2006/0198404 | A1 | 9/2006 | Henrichs |
| 2007/0047603 | A1 | 3/2007 | Oomori |
| 2007/0058357 | A1 | 3/2007 | Yamaguchi et al. |
| 2007/0075306 | A1 | 4/2007 | Hayashi et al. |
| 2008/0068821 | A1 * | 3/2008 | Wang ..................... H01L 33/60 257/E33.072 |
| 2008/0116473 | A1 * | 5/2008 | Sugiyama ............. H01L 33/483 257/E33.07 |
| 2008/0192787 | A1 | 8/2008 | Yamamoto et al. |
| 2009/0003400 | A1 | 1/2009 | Nagahama et al. |
| 2009/0129085 | A1 | 5/2009 | Aizar et al. |
| 2009/0230413 | A1 | 9/2009 | Kobayakawa et al. |
| 2009/0236618 | A1 | 9/2009 | Yasuda |
| 2010/0066979 | A1 | 3/2010 | Miyazaki |
| 2010/0148203 | A1 | 6/2010 | Hashimoto et al. |
| 2010/0155748 | A1 | 6/2010 | Chan et al. |
| 2010/0328926 | A1 | 12/2010 | Hoelen et al. |
| 2011/0133222 | A1 | 6/2011 | Allen et al. |
| 2011/0216550 | A1 | 9/2011 | Koike et al. |
| 2011/0280020 | A1 | 11/2011 | Chen et al. |
| 2011/0310362 | A1 | 12/2011 | Komatsu |
| 2012/0039072 | A1 | 2/2012 | Lell et al. |
| 2012/0138974 | A1 | 6/2012 | Yoo et al. |
| 2012/0236582 | A1 | 9/2012 | Waragaya et al. |
| 2012/0242912 | A1 | 9/2012 | Kitano |
| 2012/0327374 | A1 | 12/2012 | Kitano et al. |
| 2013/0004399 | A1 | 1/2013 | Knies et al. |
| 2013/0039374 | A1 | 2/2013 | Lutgen et al. |
| 2013/0043499 | A1 | 2/2013 | Ohta et al. |
| 2013/0044501 | A1 | 2/2013 | Rudisill et al. |
| 2013/0107523 | A1 | 5/2013 | Takeda |
| 2013/0126916 | A1 | 5/2013 | Arai et al. |
| 2013/0229631 | A1 | 9/2013 | Toyooka et al. |
| 2013/0272329 | A1 * | 10/2013 | Auen ..................... H01S 5/024 372/34 |
| 2013/0319504 | A1 | 12/2013 | Yang et al. |
| 2013/0329397 | A1 * | 12/2013 | Shimizu .................... F21V 7/26 362/84 |
| 2014/0153238 | A1 * | 6/2014 | Nishimura .......... H01L 25/0753 362/293 |
| 2014/0160782 | A1 | 6/2014 | Harada |
| 2014/0197528 | A1 | 7/2014 | Nagata |
| 2014/0375970 | A1 | 12/2014 | Nagahara |
| 2015/0036107 | A1 | 2/2015 | Nagahara et al. |
| 2015/0270682 | A1 | 9/2015 | Daniels et al. |
| 2015/0292687 | A1 | 10/2015 | Sugiyama |
| 2015/0303648 | A1 * | 10/2015 | Kozuru ................... F21V 13/08 362/235 |
| 2015/0309399 | A1 | 10/2015 | Kim et al. |
| 2016/0087399 | A1 | 3/2016 | Horn et al. |
| 2017/0097561 | A1 | 4/2017 | Komatsu |

FOREIGN PATENT DOCUMENTS

| | | | |
|---|---|---|---|
| JP | 2006261292 | A | 9/2006 |
| JP | 2007081234 | A | 3/2007 |
| JP | 2007123444 | A | 5/2007 |
| JP | 2008-305936 | A | 12/2008 |
| JP | 2009-289976 | A | 12/2009 |
| JP | 2010-165834 | A | 7/2010 |
| JP | 04-823300 | | 11/2011 |
| JP | 2012-003923 | A | 1/2012 |
| JP | 2012-022802 | A | 2/2012 |
| JP | 2012-094728 | A | 5/2012 |
| JP | 2012-512508 | A | 5/2012 |
| JP | 4930162 | B2 | 5/2012 |
| JP | 5435854 | B2 | 3/2014 |
| JP | 2015045843 | A | 3/2015 |
| JP | 2015-195330 | A | 11/2015 |
| WO | 2013/179732 | A1 | 12/2013 |
| WO | WO-2014180682 | A1 * | 11/2014 ......... H01S 5/02212 |

OTHER PUBLICATIONS

Machine English Translation of JP2010165834A, Morizumi (Year: 2010).
Claims of U.S. Appl. No. 16/103,879, filed Oct. 2019 Kozuru et al. (Year: 2019).
Office Action with Form PTO-892 Notice of References Cited issued by the U.S. Patent and Trademark Office for the U.S. Appl. No. 14/689,984, filed Mar. 24, 2017.
Office Action with Form PTO-892 Notice of References Cited issued by the U.S. Patent and Trademark Office for the U.S. Appl. No. 14/689,984, filed Aug. 8, 2017.
Advisory Action issued by the U.S. Patent and Trademark Office for the U.S. Appl. No. 14/689,984, filed Nov. 3, 2017.
Office Action with Form PTO-892 Notice of References Cited issued by the U.S. Patent and Trademark Office for the U.S. Appl. No. 14/689,984, filed Dec. 4, 2017.
Notice of Allowance with Form PTO-892 Notice of References Cited issued by the U.S. Patent and Trademark Office for the U.S. Appl. No. 14/689,984, filed May 15, 2018.
Office Action with Form PTO-892 Notice of References Cited issued by the U.S. Patent and Trademark Office for the U.S. Appl. No. 16/103,879, filed Sep. 11, 2018.
Office Action with Form PTO-892 Notice of References Cited issued by the U.S. Patent and Trademark Office for the U.S. Appl. No. 16/103,879, filed Feb. 15, 2019.
Office Action with Form PTO-892 Notice of References Cited issued by the U.S. Patent and Trademark Office for the U.S. Appl. No. 16/103,879, filed Aug. 16, 2019.
Notice of Allowance with Form PTO-892 Notice of References Cited issued by the U.S. Patent and Trademark Office for the U.S. Appl. No. 16/103,879, filed Nov. 6, 2019.
Office Action with Form PTO-892 Notice of References Cited issued by the U.S. Patent and Trademark Office for the U.S. Appl. No. 16/775,432, filed Mar. 13, 2020.
Office Action with Form PTO-892 Notice of References Cited issued by the U.S. Patent and Trademark Office for the U.S. Appl. No. 16/775,432, filed Aug. 12, 2020.

(56) References Cited

OTHER PUBLICATIONS

Office Action with Form PTO-892 Notice of References Cited issued by the U.S. Patent and Trademark Office for the U.S. Appl. No. 16/775,432, filed Nov. 30, 2020.

Notice of Allowance with Form PTO-892 Notice of References Cited issued by the U.S. Patent and Trademark Office for the U.S. Appl. No. 16/775,432, filed May 19, 2021.

\* cited by examiner

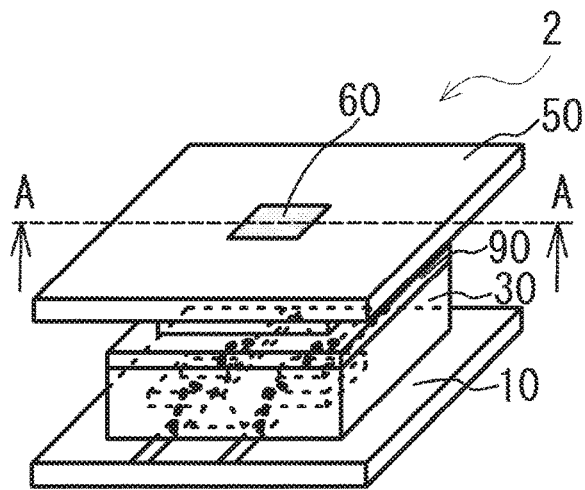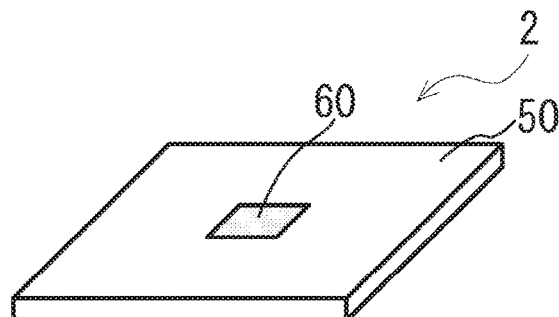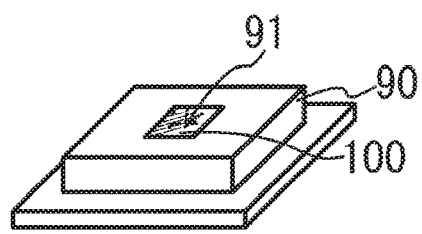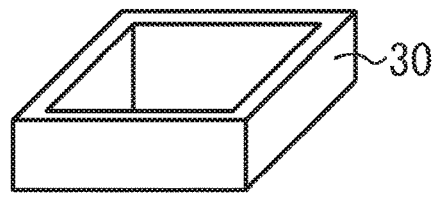
FIG.2A
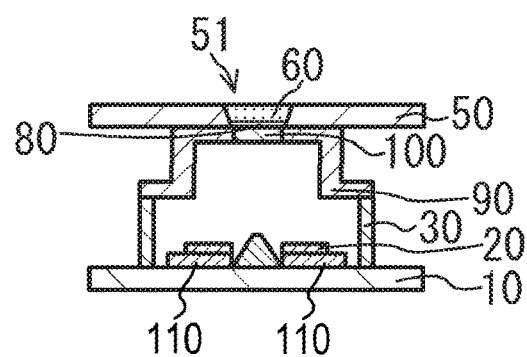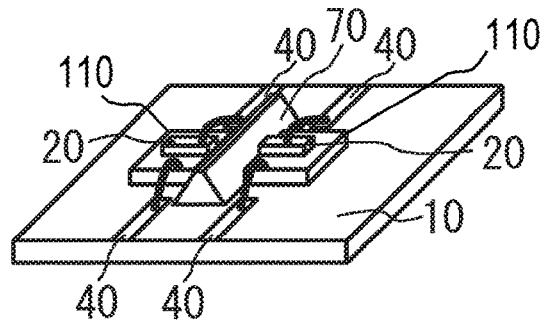
FIG.2C  FIG.2B

LIGHT EMITTING DEVICE

CROSS-REFERENCE TO RELATED APPLICATIONS

The present application is a continuation of U.S. patent application Ser. No. 16/775,432 filed on Jan. 29, 2020, which is a continuation of U.S. patent application Ser. No. 16/103,879, filed on Aug. 14, 2018 (now U.S. Pat. No. 10,587,091), which is a continuation of U.S. patent application Ser. No. 14/689,984, filed on Apr. 17, 2015 (now U.S. Pat. No. 10,079,470), which claims priority to Japanese Patent Application No. 2014-086931, filed on Apr. 18, 2014, the entireties of which are hereby incorporated by reference.

BACKGROUND

1. Field

The present disclosure relates to a light emitting device.

2. Description of the Related Art

Conventionally, a light emitting device provided with a plurality of semiconductor laser elements (LD 16) and a wavelength converting member (fluorescent body layer 65) on a base (radiator 17) has been proposed (refer to Japanese Patent Application Laid-open No. 2012-22802).

SUMMARY

An object of the present disclosure is to provide a light emitting device with high heat dissipation performance.

A light emitting device includes: a base; a plurality of semiconductor laser elements that are disposed on the base and that are configured to emit light laterally from the plurality of semiconductor laser elements; a reflecting member that is disposed on the base and configured to reflect light from the plurality of semiconductor laser elements; a surrounding part that is disposed on the base and that surrounds the plurality of semiconductor laser elements and the reflecting member; a wiring part that is disposed on the base so as to extend to a location outside of the surrounding par, the wiring part being electrically connected to the plurality of semiconductor laser elements; a radiating body disposed on the surrounding part, the radiating body comprising at least one of a metal and a ceramic, and the radiating body having an opening; and a wavelength converting member that is located in the opening of the radiating body, the wavelength converting member being configured to convert a wavelength of light that is emitted from the plurality of semiconductor laser elements and reflected upward by the reflecting member.

Deterioration of semiconductor laser elements and deterioration of a wavelength converting member can be suppressed.

BRIEF DESCRIPTION OF THE DRAWINGS

FIG. 2A is a schematic perspective view of a light emitting device according to a second embodiment, FIG. 2B is a schematic exploded view in FIG. 2A, and FIG. 2C is a schematic end view taken along a line A-A in FIG. 2A.

DETAIL DESCRIPTION

[Light Emitting Device 1 According to First Embodiment]

Figure 1A:
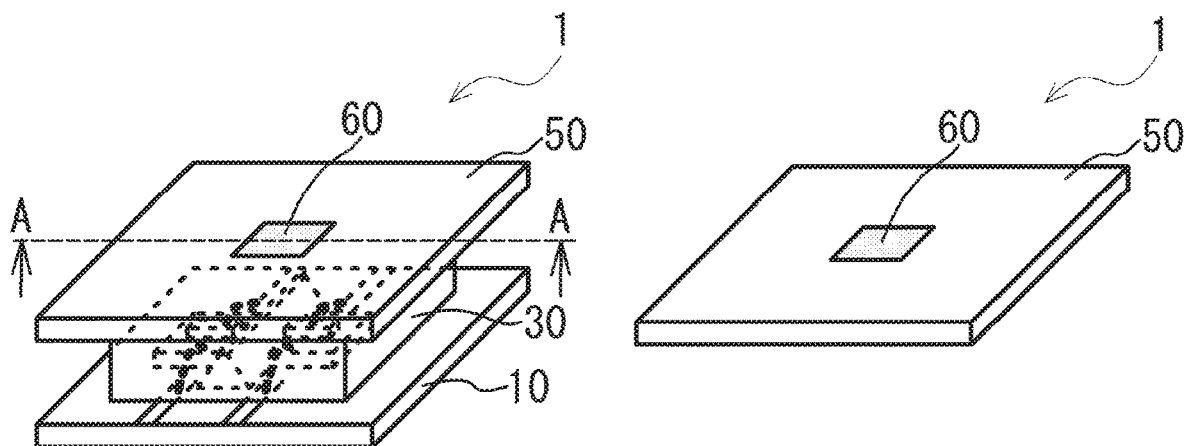
FIG. 1A is a schematic perspective view of a light emitting device according to a first embodiment.
Figure 1C:
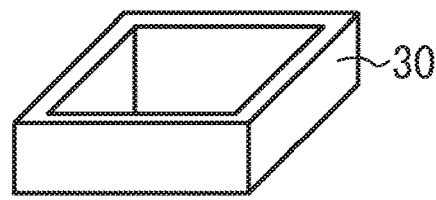
FIG. 1C is a schematic end view taken along a line A-A in FIG. 1A.
Figure 1C:
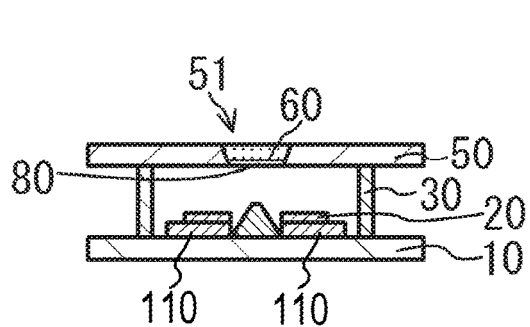
Figure 1B:
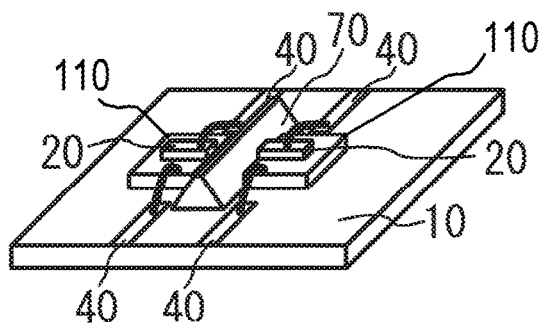
FIG. 1B is a schematic exploded view in FIG. 1A.

FIG. 1A is a schematic perspective view of a light emitting device 1 according to a first embodiment, FIG. 1B is an schematic exploded view in FIG. 1A, and FIG. 1C is a schematic end view taken along a line A-A in FIG. 1A.

In FIG. 1A, portions of members are transparently shown using dashed lines in order to facilitate understanding.

As shown in FIGS. 1A to 1C, the light emitting device 1 includes: a base 10; a plurality of semiconductor laser elements 20 that are disposed on the base 10 and that are configured to emit light laterally from the plurality of semiconductor laser elements; a reflecting member 70 that is disposed on the base 10 and configured to reflect light from the plurality of semiconductor laser elements 20; a surrounding part 30 that is disposed on the base 10 and that surrounds the plurality of semiconductor laser elements 20 and the reflecting member 70; a wiring part 40 that is disposed on the base 10 so as to extend to a location outside of the surrounding part 30, the wiring part being electrically connected to the plurality of semiconductor laser elements 20; a radiating body 50 disposed on the surrounding part, the radiating body comprising at least one of a metal and a ceramic, and the radiating body having an opening 51; and a wavelength converting member 60 that is located in the opening 51 of the radiating body 50, the wavelength converting member being configured to convert a wavelength of light that is emitted from the plurality of semiconductor laser elements 20 and reflected upward by the reflecting member 70.

When a light emitting device includes a plurality of semiconductor laser elements, discharge of heat generated at each of the semiconductor laser elements from a base is inhibited. Therefore, heat is likely to accumulate in the semiconductor laser elements and, as a result, the semiconductor laser elements deteriorate faster.

In consideration thereof, in the light emitting device 1, each of the semiconductor laser elements 20 is arranged on the base 10 so that light is emitted to the side in a lateral direction. Accordingly, since distances from the semiconductor laser elements 20 to the base 10 are reduced and heat radiation performance is improved, deterioration of the semiconductor laser elements 20 can be suppressed.

In addition, when a light emitting device includes a plurality of semiconductor laser elements, since light emitted from the plurality of semiconductor laser elements enters a wavelength converting member, the amount of heat generated at the wavelength converting member increases. As a result, the wavelength converting member deteriorates faster. In consideration thereof, in the light emitting device 1, the wavelength converting member 60 is provided on the radiating body 50 containing at least one of metals and ceramics. Accordingly, since heat generated at the wavelength converting member 60 can be released using the radiating body 50, deterioration of the wavelength converting member 60 can be suppressed.

Hereinafter, primary members and the like of the light emitting device 1 will be described in order.

(Light Emitting Device 1)

The light emitting device 1 can be preferably used as, for example, a surface-mounted light emitting device.

(Base 10)

As the base 10, a member containing ceramics such as aluminum nitride and aluminum oxide can be used.

Heat generated by the plurality of semiconductor laser elements 20 is released via the base 10.

(Plurality of Semiconductor Laser Elements 20)

The plurality of semiconductor laser elements 20 are arranged on the base 10 so that light is emitted to the side.

The semiconductor laser elements 20 may be directly provided on the base 10 or may be provided on the base 10 via a sub-mount Example of material of sub-mount can be provided by aluminum nitride or silicon carbide.

Nitride semiconductor laser elements or the like can be used as the semiconductor laser elements 20.

Light emitted to the side by the plurality of semiconductor laser elements 20 is reflected by the reflecting member 70, changes its direction to upward, and enters the wavelength converting member 60 provided in the opening 51 of the radiating body 50.

As shown in FIG. 1B, since the semiconductor laser elements 20 are provided so that main surfaces thereof face the base 10, heat from the semiconductor laser elements 20 can be efficiently discharged via the base 10. Either of an n electrode or a p electrode is provided on the main surface (lower surface of the semiconductor laser elements 20 in FIGS. 1A to 1C) of the semiconductor laser elements 20 on the side of the base 10, and the electrode is electrically connected to the wiring part 40, for example, via a sub-mount.

In addition, a main surface (upper surface of the semiconductor laser elements 20 in FIGS. 1A to 1C) opposite to the main surface (lower surface of the semiconductor laser elements 20 in FIGS. 1A to 1C) described above is provided with the other electrode of an n electrode and a p electrode, and the electrode is electrically connected to the wiring part 40, for example, via a metal wire.

The number of semiconductor laser elements 20 to be provided in one light emitting device 1 is at least 2 or more and can be, for example, 10 or more. By increasing a package size, around 10 to 100 semiconductor laser elements 20 can be provided in one light emitting device 1.

When arranging a plurality of semiconductor laser elements 20 on one side of the reflecting member 70, a distance between adjacent semiconductor laser elements 20 can be set to, for example, 200 μm or more and 1000 μm or less.

(Reflecting Member 70)

The reflecting member 70 is a member that reflects light from the plurality of semiconductor laser elements 20 toward the wavelength converting member 60 and which is provided on the base 10.

A shape of the reflecting member 70 is not particularly limited.

For example, when the reflecting member 70 is positioned between a plurality of semiconductor laser elements 20, a member with an approximately triangular prism shape (with a triangle-like trapezoidal section) as shown in FIG. 1A to 1C or the like can be used as the reflecting member 70.

As the reflecting member 70, for example, optical glass made of synthetic quartz or the like in which a portion to be irradiated by laser light is provided with a reflective film can be used.

Since such members exhibit high heat resistance, the members can be used with less deterioration even when irradiated with light from the plurality of semiconductor laser elements 20.

As the reflective film, a metal film made of silver, aluminum, or the like or a dielectric multilayer film in which oxide films of silicon oxide or tantalum oxide or the like are laminated can be used.

(Surrounding Part 30)

The surrounding part 30 is provided on the base 10, and surrounds the plurality of semiconductor laser elements 20 and the reflecting member 70.

Accordingly, since light output of the plurality of semiconductor laser elements 20 is prevented from declining due to optical dust collection or the like, the life of the light emitting device 1 can be prolonged.

Ceramics or metals such as iron can be used for the surrounding part 30.

(Wiring Part 40)

The wiring part 40 is provided on the base 10 so as to extend to the outside of the surrounding part 30, i.e., to the outside of a peripheral edge of the surrounding part 30.

Accordingly, since the wiring part 40 need not be arranged below the base 10, an entire lower surface of the base 10 can be used as a heat radiating surface.

In other words, heat generated by the plurality of semiconductor laser elements 20 is released via the base 10 in an efficient manner.

The wiring part 40 is electrically connected to the plurality of semiconductor laser elements 20.

By energizing the wiring part 40, power can be supplied to the plurality of semiconductor laser elements 20.

The wiring part 40 is divided into an anode (p electrode side) and a cathode (n electrode side).

While the anode and the cathode are extracted outward in different directions in the light emitting device 1 shown in FIGS. 1A to 1C, the anode and the cathode may alternatively be extracted in a same direction.

(Radiating Body 50)

The radiating body 50 is provided on the surrounding part 30.

By constructing the radiating body 50 and the surrounding part 30 with separate members, since a heat radiating path of the wavelength converting member 60 can be more readily secured separately from a heat radiating path of the semiconductor laser elements 20, heat generated at the wavelength converting member 60 is efficiently radiated via the radiating body 50.

The radiating body 50 may be directly provided on the surrounding part 30 (refer to FIGS. 1A to 1C) or may be provided on the surrounding part 30 via another member (refer to FIG. 2A to 2C).

The radiating body 50 can be connected to the surrounding part 30 or another member provided between the surrounding part 30 and the radiating body 50 using AuSn, low-melting point glass, or the like.

A material with a thermal conductivity of 100 W/mK or more is preferably used for the radiating body 50.

For example, materials with high heat radiation performance including metals such as copper and aluminum, ceramics such as an AlN sintered body and a SiC sintered body, or a combination of such metals and ceramics are used.

The radiating body 50 has an opening 51.

The plurality of semiconductor laser elements 20 are surrounded by the surrounding part 30 which reflects light emitted from the plurality of semiconductor laser elements 20. The light emitted from the plurality of semiconductor laser elements 20 is emitted to the outside of the surrounding part 30 by passing through the opening 51 of the radiating body 50 provided above the surrounding part 30. Therefore, in the light emitting device 1, an opening plane of the opening 51 constitutes a light emitting plane.

A shape of the opening 51 of the radiating body 50 is not particularly limited.

Examples of the shape of the opening 51 may include a cylinder, a truncated cone, a pyramidal frustum, and a rectangular parallelepiped.

Although not particularly limited, the opening 51 of the radiating body 50 preferably has an inner surface that is inclined such that the opening plane thereof becomes wider as it goes upward.

Accordingly, light extraction efficiency of the light emitting device 1 is improved.

Examples of such a shape include an inverted truncated cone and an inverted pyramidal frustum.

A reflective film can be provided on an inner surface of the radiating body 50.

Accordingly, since light absorbed by the radiating body 50 can be reflected by the reflective film, light extraction efficiency is improved.

As the reflective film, metals including Au, Ag, or Al can be used.

The wavelength converting member 60 is preferably provided inside the opening 51 of the radiating body 50.

In this case, the opening 51 of the radiating body 50 can be formed so that a peripheral edge thereof is farther inward than a peripheral edge of the surrounding part 30.

Accordingly, high-output light can be emitted without increasing a size of the light emitting plane. Furthermore, by concentrating light emitted from the plurality of semiconductor laser elements 20 on the wavelength converting member 60, light with high luminance can be emitted from the wavelength converting member 60.

The radiating body 50 is formed in, for example, a flat plate shape. Accordingly, a heat sink or the like can be readily provided on an upper surface of the radiating body 50.

In addition, when the radiating body 50 has a flat plate shape, the opening 51 of the radiating body 50 (wavelength converting member 60) is positioned closer to the reflecting member 70 compared to a case where, for example, the radiating body 50 has a curved plane shape or the radiating body 50 has irregularities.

Accordingly, since light emitted from the plurality of semiconductor laser elements 20 enters and exits the wavelength converting member 60 before the light is completely diffused, the light emitting plane of the light emitting device 1 can be reduced and light with high luminance can be extracted from the light emitting device 1.

The peripheral edge of the radiating body 50 is positioned farther outward than, for example, the peripheral edge of the surrounding part 30.

Accordingly, heat of the wavelength converting member 60 can be more readily diffused.

A thermal conductivity of the radiating body 50 can be set higher than a thermal conductivity of the surrounding part 30.

Accordingly, since radiation via the radiating body 50 of heat generated at the wavelength converting member 60 is promoted, a decline in conversion efficiency of the wavelength converting member 60 due to heat can be suppressed.

While an area of an upper surface of the radiating body 50 may be equal to an area of an upper surface of the base 10, the area of the upper surface of the radiating body 50 may be greater than the area of the upper surface of the base 10.

When the area of the upper surface of the radiating body 50 is greater than the area of the upper surface of the base 10, heat generated at the wavelength converting member 60 is more readily discharged via the radiating body 50 than in a case where the area of the upper surface of the radiating body 50 is equal to the area of the upper surface of the base 10.

(Wavelength Converting Member 60)

The wavelength converting member 60 is provided in the opening 51 of the radiating body 50.

After being reflected by the reflecting member 70, the light emitted from the plurality of semiconductor laser elements 20 enters the wavelength converting member 60, whereby a part of the light is subjected to wavelength conversion and then emitted from the wavelength converting member 60.

The wavelength converting member 60 preferably has a plate shape.

While the wavelength converting member 60 may be provided in plurality, a single wavelength converting member 60 is provided as shown in FIG. 1A and the like in order to obtain light with high luminance.

A transmissive member containing a fluorescent body or the like can be used for the wavelength converting member 60.

In this case, the light emitted from the plurality of semiconductor laser elements 20 excites the fluorescent body contained in the transmissive member. As a result, light with a different wavelength from the light emitted from the plurality of semiconductor laser elements 20 is emitted from the fluorescent body and outputted from the transmissive member.

Non-coherent light is an example of light emitted from the wavelength converting member 60.

When semiconductor laser elements emitting blue light are used as the semiconductor laser elements 20, a fluorescent body that emits yellow light using excitation light from the semiconductor laser elements 20 can be used.

In this case, the light emitted from the wavelength converting member 60 is white light that is a mixture of blue light and yellow light.

Examples of a fluorescent body emitting yellow light include a YAG fluorescent body, a TAG fluorescent body, and a strontium silicate fluorescent body.

In addition, an inorganic member is preferably used as the transmissive member. For example, aluminum oxide, silicon oxide, titanium oxide, glass, or the like can be used.

Accordingly, the wavelength converting member 60 can be given high resistance to heat and light.

In the present embodiment, a sintered body of a YAG fluorescent body and aluminum oxide is used as the wavelength converting member 60.

A filter 80 which transmits light emitted from the plurality of semiconductor laser elements 20 and reflects light subjected to wavelength conversion at the wavelength converting member 60 may be provided below the wavelength converting member 60.

Accordingly, since the light extraction efficiency of the light emitting device 1 is improved, light with even higher luminance can be extracted from the light emitting device 1.

As the filter 80, for example, a member with reflectance of 90% or higher with respect to light which has a predetermined wavelength (light having a same wavelength as the light emitted from the plurality of semiconductor laser elements 20) and which enters at an incidence angle of 45 degrees or more can be used.

A part of light entering the wavelength converting member 60 from under the wavelength converting member 60 (light emitted from the plurality of semiconductor laser elements 20) is reflected inside the wavelength converting member 60 and which attempts to exit the wavelength converting member 60 in a downward direction.

However, by using the member described above as the filter 80, such light is efficiently reflected by the filter 80 and returned to the inside of the wavelength converting member 60.

As a result, the light extraction efficiency of the light emitting device 1 is improved and light with even higher luminance can be extracted from the light emitting device 1.

(Heat Sink)

An upper surface of the radiating body 50 can be connected to a heat sink.

Accordingly, heat radiation performance of the light emitting device 1 as a whole is improved.

In addition, even in a case where heat dissipation is difficult through a path from lower surface of radiating body 50 to surrounding part 30 due to low thermal conductivity of the surrounding part 30, heat dissipation can be performed through a path from upper surface of radiating body 50 to heat sink.

[Light Emitting Device 2 According to Second Embodiment]

FIG. 2A is a schematic perspective view of a light emitting device 2 according to a second embodiment, FIG. 2B is a perspective exploded view in FIG. 2A, and FIG. 2C is a perspective end view taken along a line A-A in FIG. 2A.

In FIG. 2A, portions of members are transparently shown using dashed lines in order to facilitate understanding in a similar manner to FIG. 1A.

As shown in FIG. 2A to 2C, the light emitting device 2 according to the second embodiment differs from the light emitting device 1 according to the first embodiment in that a cap 90 having an opening 91 is provided between the surrounding part 30 and the radiating body 50.

The opening 91 of the cap 90 is provided so that the opening 91 of the cap 90 at least partially overlaps with the opening 51 of the radiating body 50 so as to enable light to be emitted from the opening 51 of the radiating body 50.

With the light emitting device 2 according to the second embodiment, a material with high heat radiation performance can be used in the radiating body 50 while ensuring airtightness with the cap 90.

The opening 91 of the cap 90 is preferably provided with a sealing member 100 as shown in FIG. 2A to 2C.

Accordingly, the plurality of semiconductor laser elements 20 can be hermetically sealed.

As a result, since a decline in output due to optical dust collection or the like is further suppressed, the life of the light emitting device can be further prolonged.

A transmissive member such as ceramics and glass can be used as the sealing member 100.

In order to provide hermetic sealing, preferably, the cap 90 and the surrounding part 30 are welded together. To this end, preferably, the entire cap 90 or at least an end portion of the cap 90 on a side in contact with the surrounding part 30 and the entire surrounding part 30 or at least an end portion of the surrounding part 30 on a side in contact with the cap 90 are constructed from metal members.

Known materials can be used as a material of the cap 90.

For example, when the cap 90 and the surrounding part 30 are to be joined together by welding, a material with weldability such as kovar can be used as the material of the cap 90.

In addition, when the cap 90 and the surrounding part 30 are to be joined together by AuSn or low-melting point glass, ceramics or metals other than kovar can be used as the material of the cap 90.

Joining the cap 90 and the surrounding part 30 by welding only at joint portions, it is possible to join the cap 90 and the surrounding part 30 without causing thermal deterioration of the semiconductor laser elements 20 and the like.

(Heat Sink)

Figure 3A:
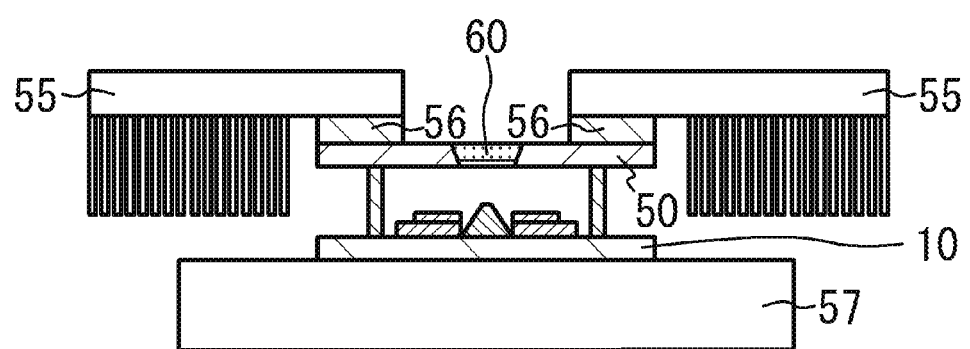
FIGS. 3A and 3B are a cross-sectional view and a plan view, respectively, showing an example of a light emitting device including a heat sink.
Figure 3B:
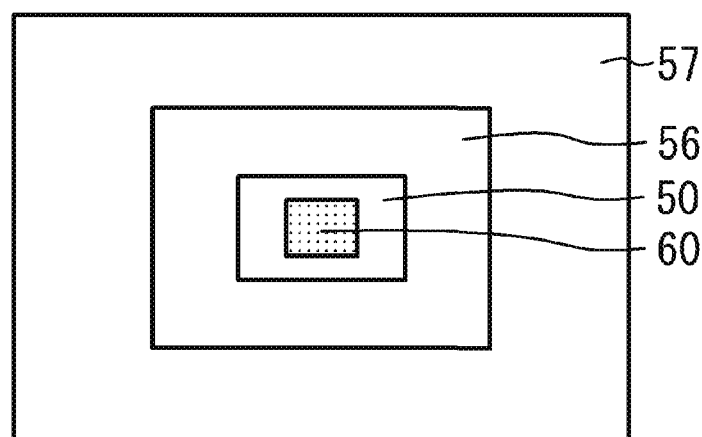

FIGS. 3A and 3B are a sectional view and a plan view, respectively, showing an example of a light emitting device including a heat sink.

In FIG. 3B, illustration of radiating fins 55 is omitted to make positions where temperature regulators 56 are arranged easily recognizable.

As shown in FIGS. 3A and 3B, the heat sink includes the radiating fins 55 and the temperature regulators 56.

The radiating fins 55 are constructed from, for example, aluminum or copper.

In addition, the temperature regulators 56 are constituted by, for example, Peltier elements.

As shown in FIGS. 3A and 3B, the light emitting device may further include a heat radiating platform 57.

The heat radiating plate 57 is connected to, for example, an entire lower surface of the base 10.

Accordingly, heat generated by a plurality of semiconductor laser elements 20 is more easily discharged to the heat radiating plate 57.

While embodiments of the present invention have been described above, the description merely represents examples thereof and is not intended to limit the configurations described in the claims in any way whatsoever.

EXPLANATION OF REFERENCE NUMERALS

1 Light emitting device
2 Light emitting device
10 Base
20 Semiconductor laser element
30 Surrounding part
40 Wiring part
50 Radiating body
51 Opening of radiating body
55 Radiating fin
56 Temperature regulator
57 Heat radiating plate
60 Wavelength converting member
70 Reflecting member
80 Filter
90 Cap
91 Opening of cap
100 Sealing member

What is claimed is:

1. A light emitting device comprising:
a plurality of semiconductor laser elements comprising at least a first semiconductor laser element and a second semiconductor laser element;
a base on which the plurality of semiconductor laser elements are disposed, and the base dissipating heat from the plurality of the semiconductor laser elements;
a surrounding part that surrounds the plurality of semiconductor laser elements in a top view;
a wavelength converting member separated from the plurality of semiconductor laser elements and having a plate shape disposed between the first semiconductor laser element and the second semiconductor laser element in the top view, light from the first semiconductor laser element and light from the second semiconductor laser element are incident on the wavelength converting member; and a plurality of wiring parts comprising at least one first wiring part and at least one second wiring part, the plurality of wiring parts being electrically connected to the first semiconductor laser element and the second semiconductor laser element via wires, wherein the first semiconductor laser element, the wavelength converting member and the second semiconductor laser element are arranged in order in a first direction in the top view, an outermost periphery of the wavelength converting member is inward of an outermost periphery of the plurality of semiconductor laser elements in the first direction in the top view, at least one of the first semiconductor laser element and the second semiconductor laser element is disposed between the at least one first wiring part and the at least one second wiring part in a second direction, and the second direction is perpendicular to the first direction.

2. The light emitting device according to claim 1, further comprising:

a light reflecting member disposed between the base and the wavelength converting member.

3. The light emitting device according to claim 2, wherein the light reflecting member disposed between the first semiconductor laser element and the second semiconductor laser element in the top view.

4. The light emitting device according to claim 2, wherein at least a portion of the light from the first semiconductor laser element and/or at least a portion of the light from the second semiconductor laser element is reflected by the light reflecting member, and at least a portion of the light reflected by the light reflecting member is wavelength converted by the wavelength converting member.

5. The light emitting device according to claim 1, wherein the wavelength converting member is disposed above the plurality of semiconductor laser elements.

6. The light emitting device according to claim 1, wherein the base is ceramic.

7. The light emitting device according to claim 1, wherein the surrounding part is ceramic.

8. The light emitting device according to claim 1, wherein at least a portion of the light from the first semiconductor laser element and/or at least a portion of the light from the second semiconductor laser element enters a lowermost surface of the wavelength converting member.

9. The light emitting device according to claim 1, wherein an uppermost point of the first semiconductor laser element is higher than the plurality of wiring parts.

10. The light emitting device according to claim 1, further comprising:

a cover disposed on the surrounding part such that the plurality of semiconductor laser elements are hermetically sealed.

11. The light emitting device according to claim 10, wherein the wavelength converting member is disposed on the cover.

12. The light emitting device according to claim 11, the cover comprises a cap having an opening and a sealing member covering the opening of the cap.

13. The light emitting device according to claim 10, wherein the first semiconductor laser element and the second semiconductor laser element are not resin sealed.

14. The light emitting device according to claim 1, wherein the wavelength converting member is separated from a semiconductor laser element among the plurality of semiconductor laser elements that is arranged at a position closest to the wavelength converting member.

15. The light emitting device according to claim 14, wherein the semiconductor laser element among the plurality of semiconductor laser elements that is arranged at the position closest to the wavelength converting member is the first semiconductor laser element or the second semiconductor laser element.

16. The light emitting device according to claim 1, wherein the wavelength converting member is separated from all the plurality of semiconductor laser devices.

17. The light emitting device according to claim 1, wherein the first semiconductor laser element and the second semiconductor laser element are not encapsulated inside the wavelength converting member.

* * * * *